(12) United States Patent
Gratrix et al.

(10) Patent No.: US 10,580,680 B2
(45) Date of Patent: Mar. 3, 2020

(54) METHODS FOR MASKING A PIN CHUCK, AND ARTICLES MADE THEREBY

(71) Applicant: M Cubed Technologies, Inc., Newtown, CT (US)

(72) Inventors: Edward Gratrix, Monroe, CT (US); William Spitzmacher, Durham, CT (US); David Casale, Philadelphia, PA (US); Derek Rollins, Philadelphia, PA (US); Robert E. Klinger, Murrieta, CA (US)

(*) Notice: Subject to any disclaimer, the term of this patent is extended or adjusted under 35 U.S.C. 154(b) by 108 days.

(21) Appl. No.: 15/660,307

(22) Filed: Jul. 26, 2017

(65) Prior Publication Data

US 2018/0033671 A1    Feb. 1, 2018

Related U.S. Application Data

(60) Provisional application No. 62/367,094, filed on Jul. 26, 2016.

(51) Int. Cl.
| | |
|---|---|
| *B25B 11/00* | (2006.01) |
| *H01L 21/683* | (2006.01) |
| *C23C 14/04* | (2006.01) |
| *C23C 14/06* | (2006.01) |
| *C23C 14/58* | (2006.01) |

(52) U.S. Cl.
CPC ........ *H01L 21/6838* (2013.01); *C23C 14/042* (2013.01); *C23C 14/0611* (2013.01); *C23C 14/5806* (2013.01); *C23C 14/588* (2013.01); *H01L 21/6833* (2013.01)

(58) Field of Classification Search
USPC .......... 269/21, 58, 289 R, 559; 361/234, 235
See application file for complete search history.

(56) References Cited

U.S. PATENT DOCUMENTS

| | | | |
|---|---|---|---|
| 4,698,901 A | 10/1987 | Davies et al. | |
| 2006/0130767 A1 | 6/2006 | Herchen | |
| 2007/0146679 A1 | 6/2007 | Sutedja et al. | |
| 2008/0138504 A1 | 6/2008 | Williams | |
| 2014/0368804 A1* | 12/2014 | Lafarre | G03F 7/70416 355/72 |
| 2015/0370178 A1* | 12/2015 | Klomp | G03F 7/70708 355/72 |
| 2016/0111318 A1* | 4/2016 | Ichinose | H01L 21/6838 430/322 |
| 2018/0047605 A1* | 2/2018 | Gratrix | H01L 21/6831 |

OTHER PUBLICATIONS

International Search Report dated Sep. 28, 2017 for International Application No. PCT/US2017/043809.

* cited by examiner

*Primary Examiner* — Joseph J Hail
*Assistant Examiner* — Shantese L McDonald
(74) *Attorney, Agent, or Firm* — Ramberg IP, LLC; Jeffrey R. Ramberg

(57) ABSTRACT

A method for selectively coating the tops of pins of a pin chuck with a high thermal stability material, such as diamond-like carbon (DLC). Non-pin areas ("valleys") of the pin chuck support surface are temporarily covered with glass frit or glass beads during the DLC coating operation. After coating, the glass frit/beads masking material may be removed, leaving the DLC material selectively coating the pin tops. The selective DLC coating avoids the cracking or warping problems due to CTE mismatch when DLC is coated over the entire pin chuck support surface, as the pin chuck material typically is very different from DLC.

10 Claims, 12 Drawing Sheets

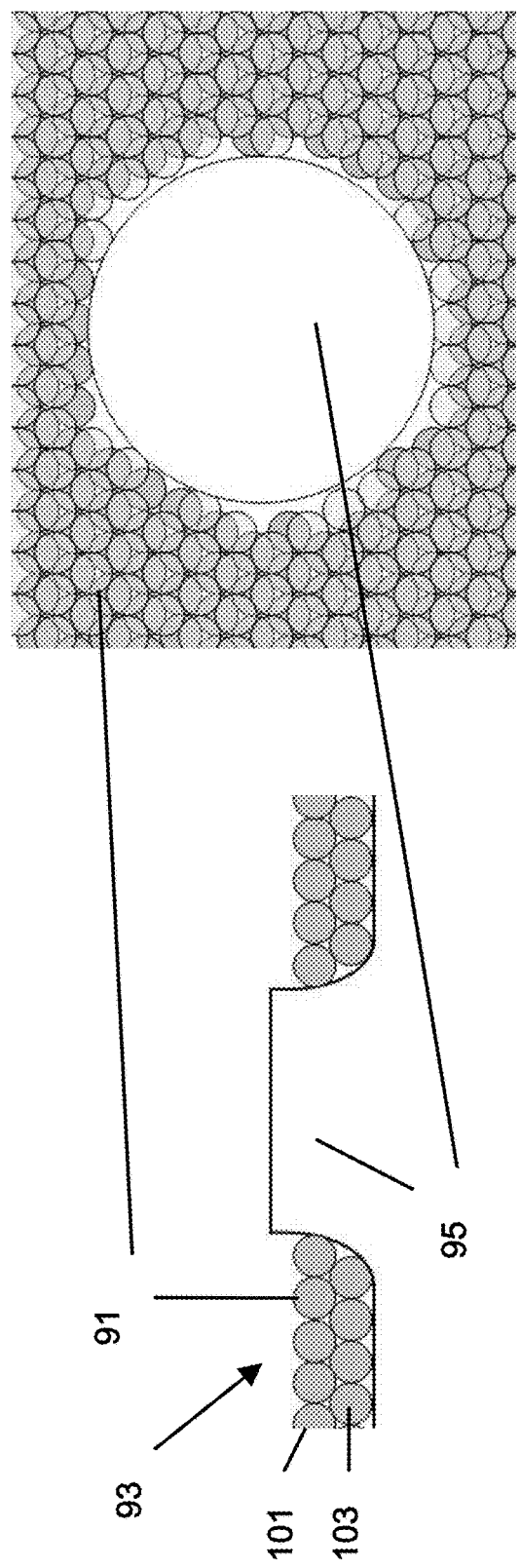

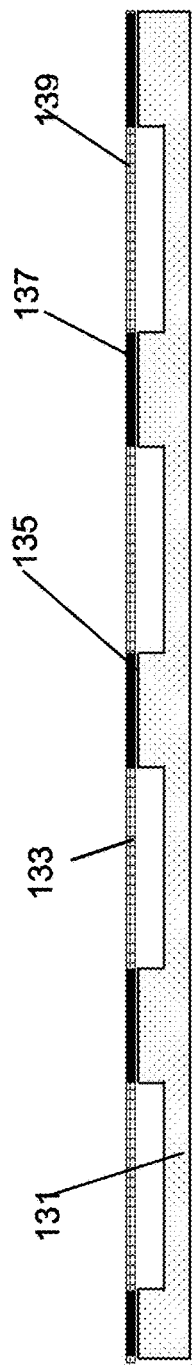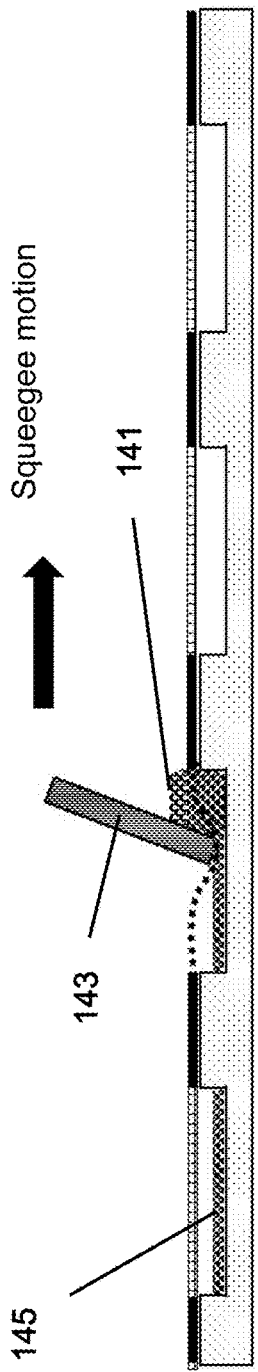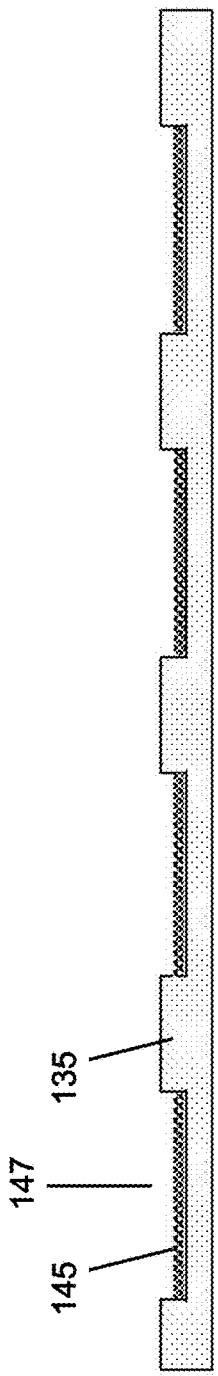

METHODS FOR MASKING A PIN CHUCK, AND ARTICLES MADE THEREBY

CROSS-REFERENCE TO RELATED APPLICATION(S)

This patent document claims the benefit of commonly owned U.S. Provisional Patent Application No. 62/367,094, filed on Jul. 26, 2016. Where permitted by law, the entire contents of this parent patent application are incorporated by reference herein.

BACKGROUND OF THE INVENTION

1. Field of the Invention

The present invention relates to chucks for supporting articles such as semiconductor wafers in a very flat, low friction and low contamination environment. More particularly, the present invention relates to pin chucks, and, in many embodiments, relates to vacuum pin chucks.

2. Discussion of Related Art

Chucks, at least in the context of precision equipment, are used to hold flat components for processing. The most common use is to hold semiconductor wafers (for example, Si, SiC, GaAs, GaN, sapphire, among others) during processing to yield a semiconductor device. Other uses include holding components during the fabrication of flat panel displays, solar cells and other such manufactured products. The wafer chucking articles are known by many names, including wafer chucks, wafer tables, wafer handling devices, etc.

To minimize the chuck-to-component contact, the component being chucked is supported on a large number of pins extending from the chuck support surface, similar or analogous to a "bed of nails". Minimum contact reduces contamination and enhances the ability to maintain high flatness. The terminal surface of the pins ("pin tops") should possess high resistance to wear during use to maximize life and precision. The pin tops also should possess low friction so that the component easily slides on and off, and lies flat on the pins. Furthermore, the pin tops should not be contaminated with metals. All of these desirable properties can be provided by a diamond-like carbon (DLC) coating.

Diamond-like carbon is a type of amorphous carbon that is based upon the sp3 hybridized form of carbon, which gives rise to characteristics similar to diamond. Unlike natural diamond, however, which is exclusively of the cubic crystalline polytype, DLC also contains significant amounts of the hexagonal, lonsdaleite, polytype. DLC typically is applied in a vacuum coating process, often involving a plasma, and often involving fillers such as sp2 graphitic carbon, and hydrogen, thereby enabling the engineering of this material's properties.

The pins on the chuck exist in many geometries, and go by many names including burls, mesas, bumps, proud lands, proud rings, etc. For chucking of flat components, the terminal surfaces of the pins are at a fixed elevation; that is, ideally they define a plane. In actual practice, there are deviations from perfect flatness, but for certain high precision applications such as chucking a semiconductor wafer for lithography, the deviations from planarity or flatness are measured in nanometers.

A vacuum pin chuck consists of a rigid body with a plurality of pins on the surface on which the component to be processed (e.g., Si wafer) rests. Other key features in the design are vacuum port(s) through the rigid body and vacuum seals. This allows the area between the pin chuck and component to be evacuated (i.e., pumped-down) so the component can be rigidly held in place on the pin tops.

Although the present discussion is regarding vacuum clamping, the embodiments of the present invention are suited to chucks with other clamping methods, such as electrostatic clamping.

The problem with applying a DLC coating to the entire surface of a pin chuck (i.e., pin tops and valleys between pins) is that mechanical stress develops due to differences in coefficient of thermal expansion (CTE), sometimes referred to as "thermal expansion mismatch". In particular, the body of the pin chuck typically is fabricated from a material that is very different from DLC, such as silicon carbide. The DLC coating process involves a temperature excursion (e.g., heating) of about 200° C. Upon cooling to ambient from the processing temperature, stress due to CTE mismatch is generated. The resulting stress can impart an unwanted flatness deviation into the part.

Film Mask Limitations

Ideally, the DLC coating would only be applied to the pin tops. One technique belonging to the prior art has been to try to "block off" or "mask" the regions of the chuck support surface during the coating process that are not pin tops. Prior art masking techniques have their limitations.

Using organic film (or a combination of organic and metal) in the base layer (or "valleys") below the pins requires coating technology and preferential photoresist techniques. Although common to the semiconductor industry, the films required for protecting DLC need to withstand the 200° C. temperature excursion as well as the compressive stress without flaking and micro masking the pin tops.

This technique also requires a photomask with precision and alignment techniques to 'expose' the preferential regions of the film.

Another problem is that organics in a plasma chamber within the field of the energetic carbon ions can cause stoichiometry issues with DLC. In particular, the interaction of the plasma with the organics can add H and O ions to the plasma, which in turn can soften the DLC film.

The instant invention addresses these issues, and provides a solution.

SUMMARY OF THE INVENTION

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

According to one embodiment of a first aspect of the invention, a mixture of a binder and glass frit or glass beads is placed in the valleys between the pins extending from the support surface of a chuck. The binder is then dried and cured. If necessary, the pin tops may be cleaned by abrasion with a "stone" to knock off any adhered glass or binder material. Thus, the pin tops are exposed, but the rest of the pin chuck is masked off from the coating material. Thus, when the pin chuck is coated with DLC material, the DLC that lands on and coats the masking material is subsequently removed along with the masking material. The pin chuck that is recovered features pin tops coated with DLC, but non-pin areas (the valleys) that are free from the DLC material.

In another embodiment of the present invention that is specific to a pinned vacuum chuck, the vacuum seal land can be used to help contain the masking material. Thus, loose beads can be poured into the valleys, and such loose beads will readily flow across the support surface out to the vacuum seal land, which acts as a barrier or containment wall for the loose beads. The loose beads may be glass or polymer. These beads may be lightly or weakly fused to one another once they are in position.

In another aspect of the invention, the DLC is coated over the entire chuck support surface. Then, and at the same DLC coating temperature, a "subtractive mask" of nickel-iron alloy is used to selectively coat a nickel-iron layer on the pin tops. The exposed DLC in the valleys between pins is then removed with oxygen plasma or further heating to about 500° C. in air. The nickel-iron layer on the pin tops is then chemically stripped off, e.g., with an etchant, leaving DLC coated on the pin tops.

BRIEF DESCRIPTION OF THE DRAWINGS

A more detailed understanding of the invention may be had from the following description, given by way of example, and to be understood in conjunction with the accompanying claims and drawings in which like reference numerals identify similar or identical elements. The drawings are not to scale.

FIG. 1A is the lowest magnification, showing the entire pin chuck support surface. FIG. 1B is intermediate magnification, and FIG. 1C is the highest magnification, showing details of individual pins, as well as the vacuum seal land.

FIGS. 9A and 9B are side and top schematic views, respectively, of two layers of glass beads occupying the valley surrounding a pin on the support surface of a pin chuck.

FIGS. 10-12 are cross-sectional schematic views of an embodiment of the invention for placing the glass beads in the valleys between adjacent pins on the support surface of the pin chuck.

DETAILED DESCRIPTION OF EMBODIMENTS OF THE INVENTION

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation".

It should be understood that the steps of the exemplary methods set forth herein are not necessarily required to be performed in the order described, and the order of the steps of such methods should be understood to be merely exemplary. Likewise, additional steps might be included in such methods, and certain steps might be omitted or combined, in methods consistent with various embodiments of the present invention.

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

The use of pins on chucking devices is to provide minimum chuck-to-component contact. Minimum contact reduces contamination and enhances the ability to maintain high flatness.

Figure 1A:
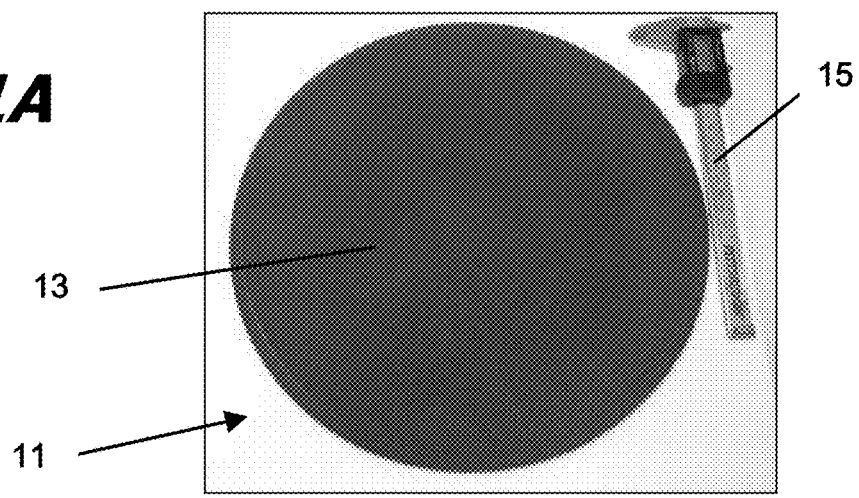
FIGS. 1A through 1C show photographs of a 300 mm diameter pin chuck at various magnifications.
Figure 1B:
Figure 1C:
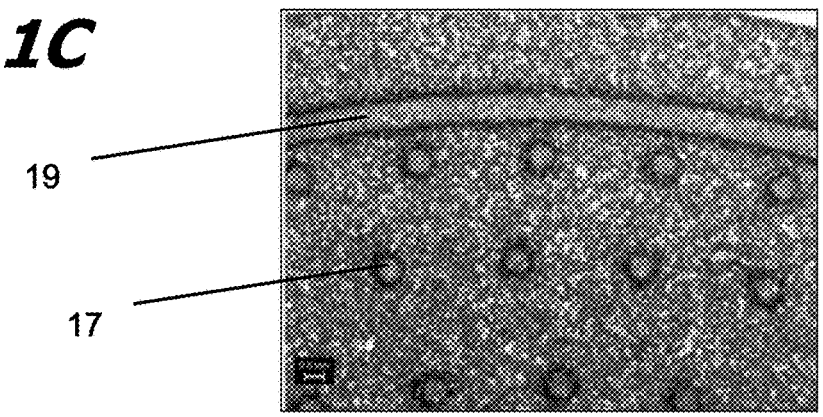

FIGS. 1A through 1C show photographs of a 300 mm diameter pin chuck 11 at various magnifications. FIG. 1A is the lowest magnification, showing the entire pin chuck support surface 13. The calipers 15 are provided in the photograph to suggest the size (scale) of the pin chuck. FIG. 1B is intermediate magnification, and FIG. 1C is the highest magnification, showing details of individual pins 17, as well as the vacuum seal land 19. Thus, this particular pin chuck is a vacuum pin chuck.

The next generation of pin chucks for processing of semiconductors, solar cells, flat panel displays, etc. require attributes provided by a diamond-like carbon ("DLC") surface coating:

High thermal stability (high thermal conductivity, low CTE)

High wear resistance

Low friction

Low metallic contamination

The terminal surfaces of the pins, that is, the pin tops, need to exhibit low wear in use to maximize life and precision. The pin tops also need to possess a low friction coefficient so the component easily slides on and off, and lies flat on the pins. Furthermore, the pin tops should be free of metallic contamination. All of these desirable properties can be provided by a diamond-like carbon coating.

However, the balance of the pin chuck typically is made from a material that is very different, and having very different properties, from that of DLC. For instance, silicon carbide (SiC) has desirable properties for use as a wafer chuck: low density, low thermal expansion coefficient, and high thermal conductivity, to name three. Silicon carbide-based bodies can be made to near-net-shape by reactive infiltration techniques.

The easiest way to coat the support surface of a pin chuck with DLC is simply to evenly coat the entire surface—pins and valleys. The DLC coating process involves an approximately 200° C. temperature excursion (that is, heating to a temperature of about 220° C.); however, and when the coated chuck is brought back to ambient temperature, the differences in thermal expansion coefficient (CTE) between the DLC and the SiC-based chuck leads to the generation of internal stress, which can cause problems such as warping of the chuck.

Thus, the goal is to apply the DLC coating only to the top of pins and not in valleys. With this limited coating, distortion of the body due to the high stress DLC coating will not occur.

Shadow Masking Limitations

The Applicant initially attempted to "block off" or "mask" the regions of the chuck support surface during the coating process that are not pin tops. Such a free standing mask, termed a "shadow mask", but also sometimes referred to as a "hard mask", often is made from metal, with openings where the coating(s) pass through the openings. One challenge with these shadow masks is the film stress and temperature excursions (+200° C.) will bend and 'peel' the mask out of position, as well as generate flaking debris.

In an effort to resolve the mask bending, Applicant experimented with making the mask thicker. However, a thick mask will result in narrow plasma openings, thus creating a depleted plasma strength for DLC. The depleted plasma strength gives rise to low energy deflection, resulting in stoichiometry changes of the film, which in turns results in softening of the coating.

The Applicant then attempted further modifications to the shadow mask, specifically making multiple holes for each pin. It found that this approach was not practical due to the very high number of pins and the very complex design of some chuck devices.

Instead, the Applicant has developed different technologies to mask off the non-pin areas of the chuck from the DLC coating—namely, by filling in these regions ("valleys") between the pins with a temporary filler prior to DLC coating. After DLC coating, the filler is then removed.

In general, the filler that temporarily masks off the non-pin areas of the chuck support surface features a plurality of small bodies of glass, metal or polymer that may be in loose form, but more typically are temporarily bonded and/or weakly bonded to one another. The bodies may range in size from about 10 microns to about 1000 microns apiece, but more typically may be about 100 microns in size. In one embodiment of the invention, the plurality of bodies takes the form of powder, grit, grain or aggregate. The bodies may be mixed with a binder, which could be organic or inorganic. The mixture could be in the form of a slurry. The mixture can be placed over the support surface by troweling or squeegeeing. The slurry is then dried, and the binder is cured. The binder could be one that cures through application of heat, or through application of radiation such as ultraviolet (UV) light.

If slurry material lands on a pin top, it can be removed in at least two ways. One way is to lightly abrade the pin tops by passing a "cleaning stone" over the pin tops to physically remove the glass frit or binder material. Another way is to selectively UV cure the binder in the valley regions, but to mask off any binder on the pin tops using a shadow mask or film. The uncured binder may then be removed through dissolution in a solvent.

The glass bodies may be about 100 microns in size, as measured by the openings in a screen or sieve. The glass bodies may range in size from about 25 microns to about 250 microns, or even from about 10 microns to about 1000 microns. Whether bound with a binder or lightly/weakly fused, glass bodies may be adhered to one another to form a glass frit.

In an alternate embodiment, beads may be used instead of glass frit. The beads may be glass, or a polymer such as PMMA or PMDS. The beads may be spherical, and may range in size from about 25 microns to about 1000 microns in diameter.

Bodies of the present embodiments that are weakly bonded or weakly fused to one another may be broken apart or debonded from one another, and from the support surface of the chuck, for example, by low-impact mechanical means such as vibration, e.g., ultrasonic vibration).

In another embodiment using beads, one may dispense with the binder, at least initially during placement of the beads on the chuck support surface. In this embodiment, the loose beads will flow quite readily, and it may be desirable to provide some kind of containment system. Where the pin chuck is a vacuum pin chuck, the bead containment may be provided by the land for the vacuum seal. The vacuum seal land forms a circular wall or barrier. Once positioned, the loose beads optionally may be bonded to one another by means of chemical vapor, or by means of heating to weakly fuse the bead bodies together.

EXAMPLES

Embodiments of the present invention will now be further described with reference to the following examples.

Example 1: Glass Frit Masking Process

This example shows an embodiment of the present masking process using a glass frit, and with reference to FIGS. 2-5.

Figure 2:
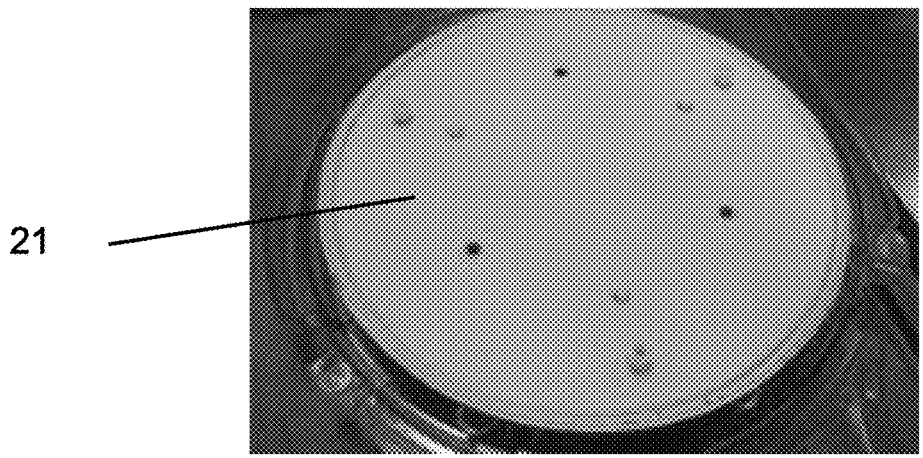
FIG. 2 is a photograph of a pin chuck after its "valleys" (regions between adjacent pins) are filled with a glass frit and binder mixture.

Glass grit bodies and binder are mixed to prepare a slurry. The slurry is then applied evenly over the support surface of the pin chuck, but leaving the tops of the pins exposed. FIG. 2 is a photograph of a pin chuck after its "valleys" (regions between adjacent pins) are filled with a glass grit and binder mixture 21. The binder is then dried and cured to form a glass frit.

Figure 3:
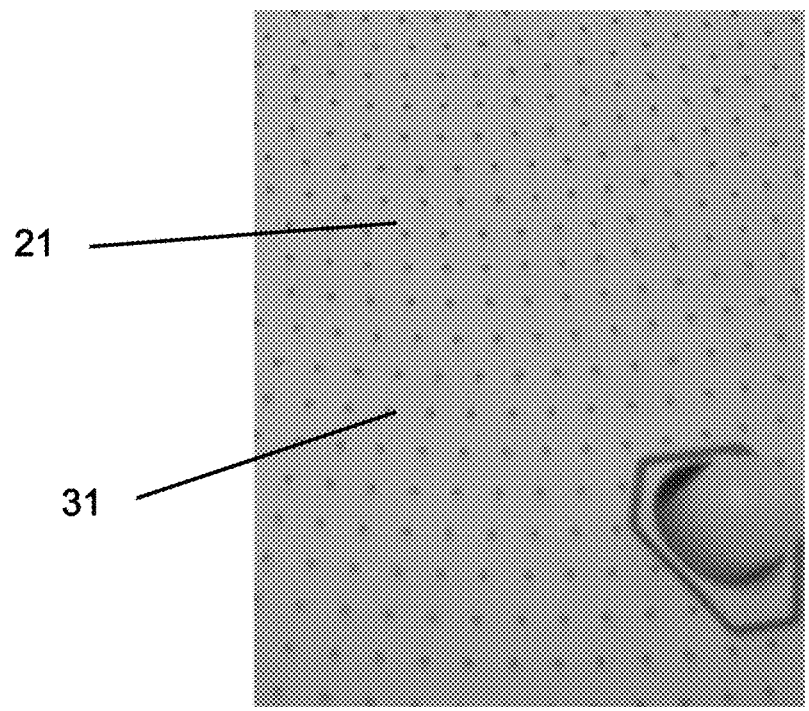
FIG. 3 is a close-up photograph of the pin chuck support surface after the glass frit/binder mixture has been dried and cured, and after removal of stray mixture material by rubbing the pin tops with a granite stone.

To the extent that any slurry material gets on the pin tops, the pin tops can be treated by abrading lightly with a cleaning stone (for example, a granite body of precise dimensions and surface roughness) to remove such stray glass bodies or binder. FIG. 3 is a close-up photograph of the pin chuck support surface after the glass frit/binder mixture has been dried and cured, and after removal of stray mixture material by rubbing the pin tops 31 with a granite stone.

Figure 4:
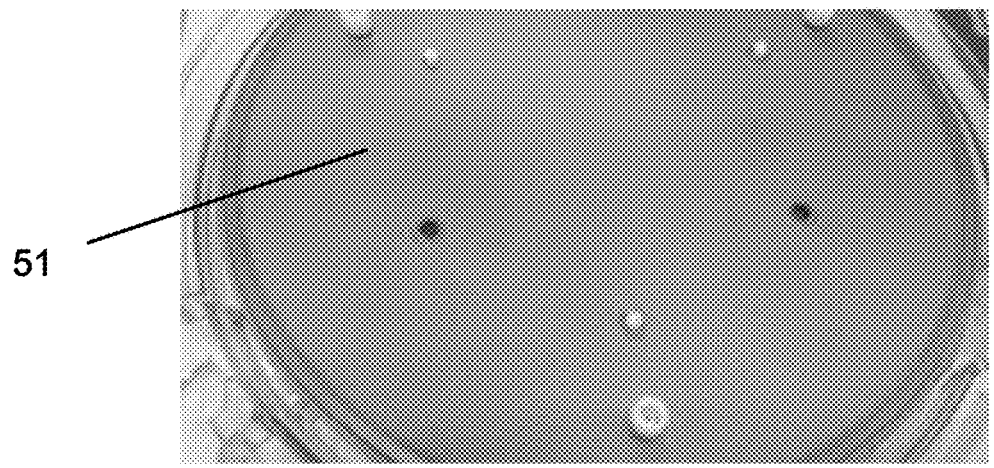
FIG. 4 is a photograph of the pin chuck after DLC coating, and after removal of the glass frit layer by ultrasonic cleaning.

Next, the masked pin chuck is coated with the DLC material. After the coating operation, the masked pin chuck is removed from the coating chamber. The frit material is then removed, for example, by ultrasonic bath/cleaning. FIG. 4 is a photograph of the pin chuck 51 after DLC coating, and after removal of the glass frit layer.

Figure 5:
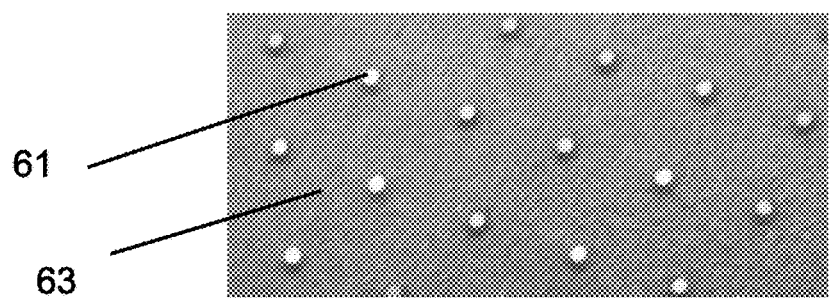
FIG. 5 is a close-up photograph of the pin chuck of FIG. 5, the close-up showing the shiny DLC coating on the pin tops, and no DLC material in the valleys between pins.

The DLC material has a very light/shiny appearance. FIG. 5 is a close-up photograph of the pin chuck of FIG. 4, the close-up showing the shiny DLC coating on the pin tops 61, and no DLC material in the valleys 63 between pins 61.

Example 2: Glass Bead Filling of Valleys for Temporary Mask

This example demonstrates the masking of the non-pin regions (valleys) of the pin chuck with glass beads. This embodiment does not feature a slurry—no organic binder is used. Instead of a frit, the glass is in the form of small beads each about 100 microns in diameter.

Figure 6:
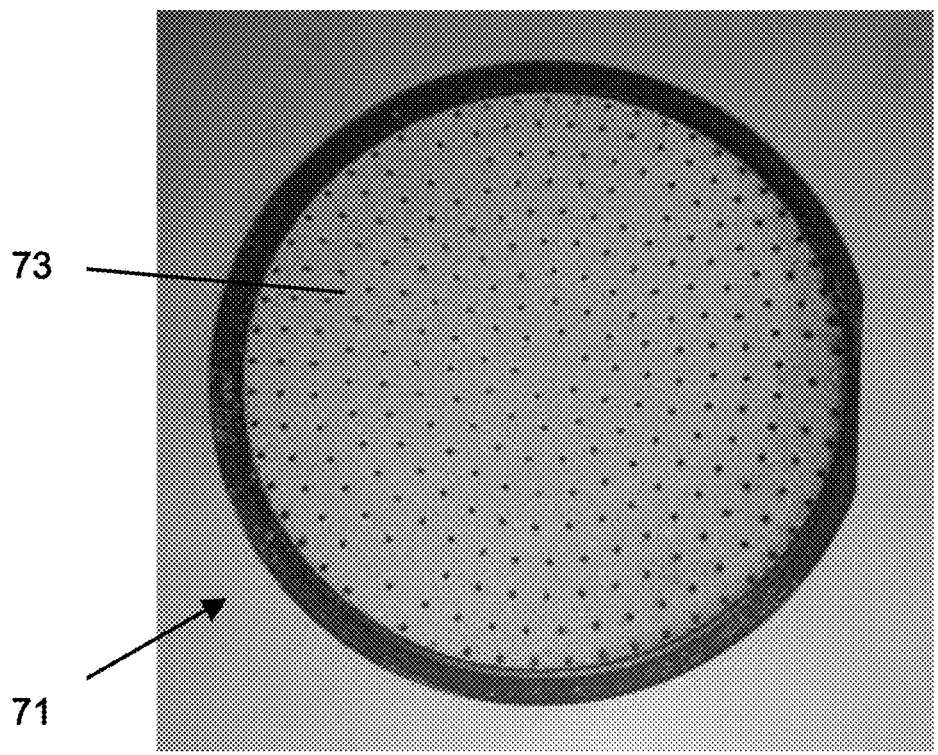
FIG. 6 is a photograph of the pin chuck of Example 2, showing the valleys between pins filled with loose, 100 micron diameter glass beads.

FIG. 6 is a photograph of the pin chuck 71 of this example, showing the valleys 73 between pins 75 filled with loose, 100-micron diameter glass beads.

Figure 7:
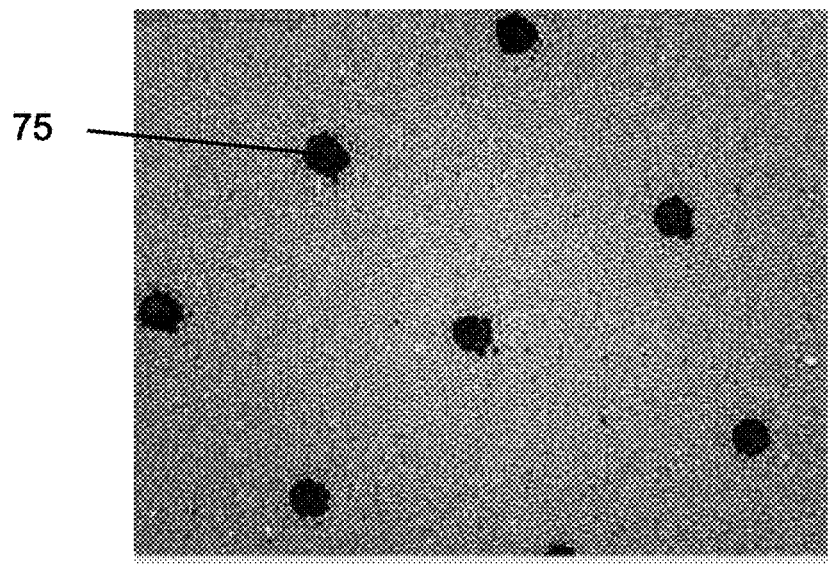
FIG. 7 is a close-up view (photograph) of the pin chuck of FIG. 6.

FIG. 7 is a close-up view (photograph) of the pin chuck of FIG. 6. One can make out individual glass beads.

Figures 8A, 8B:
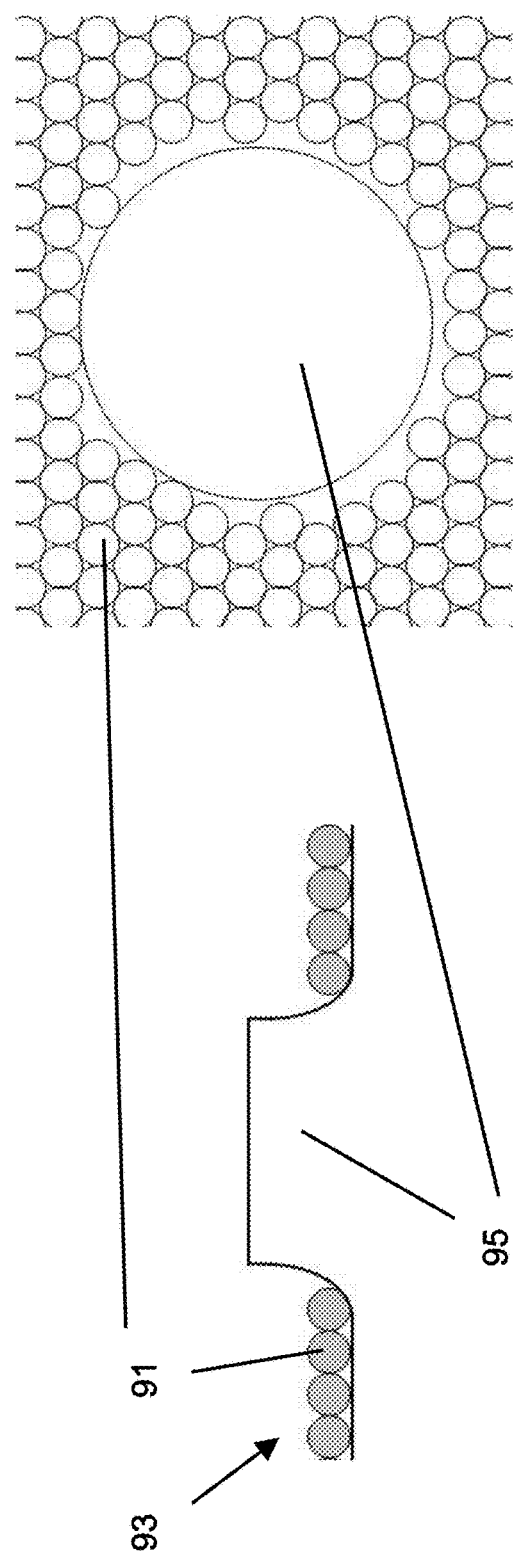
FIGS. 8A and 8B are side and top schematic views, respectively, of a single layer of glass beads occupying the valley surrounding a pin on the support surface of a pin chuck.

FIGS. 8A and 8B are side and top schematic views, respectively, of a single layer of glass beads 91 occupying the valley 93 surrounding a pin 95 on the support surface of a pin chuck.

FIGS. 9A and 9B are side and top schematic views, respectively, of two layers 101, 103 of glass beads 91 occupying the valley 93 surrounding a pin 95 on the support surface of a pin chuck.

Thus, FIGS. 8A-9B demonstrate that a minimum of two layers of glass beads are all that is required to cover the vast majority (essentially 100%) of the surface of the valleys between pins.

Example 3: A Technique for Placing a Glass Bead—Slurry

FIGS. 10-12 are cross-sectional schematic views of an embodiment of the invention for placing the glass beads in the valleys between adjacent pins on the support surface of the pin chuck.

In the first step of the process of this embodiment, as shown in FIG. 10 in particular, a screen 133 is placed flush over the pin tops 135 on the support side of the pin chuck 131. Binder material 137 is located where the screen material contacts the pin tops, but is not present elsewhere 139 on the screen 133. The binder is then cured to hold the screen firmly in place against the pin tops.

Next, and as shown in FIG. 11, a mixture or slurry of the glass beads plus binder are "squeegeed" into place. The screen openings are large enough to permit a slurry 145 of the glass beads to pass through. More specifically, a "reservoir" 141 or excess quantity of the glass bead/binder mixture is placed up against a side of the squeegee 143. The squeegee is then moved laterally along the upper surface of the screen so as to also push the excess quantity of slurry along the screen surface. Enough of the slurry mixture will fall through the holes in the screen as to potentially fill up the valleys in between adjacent pins. In addition to the lateral force on the squeegee, the operator also applies a downward force on the squeegee, depressing the screen slightly in the valleys. As a result, the slurry of glass beads do not completely fill the valleys, but instead leave behind a certain height or elevation between the top of the layer of glass beads and the top of the pins.

The final step is to remove the squeegee 143, screen 133, and binder 137, leaving a layer of glass bead/binder mixture 145 in the valleys 147 between the pins 135 of the pin chuck, as shown in FIG. 12.

Example 4: Method for Applying a DLC Coating Using a "Subtractive Mask"

This Example represents a second aspect of the present invention, in which a "subtractive mask" is used to produce the coating of DLC on the pins. Here, the subtractive mask is made from an inorganic material that can withstand high temperatures. This particular embodiment should overcome the problems with the shadow masks discussed earlier.

FIGS. 13-17 are cross-sectional schematic views of the sequence of process steps in a second aspect of the invention for selectively placing a DLC coating on the pins of a pin chuck through the use of a subtractive mask.

In this example, the bulk of the pin chuck is made from reaction bonded silicon carbide. Again, these silicon carbide-based bodies can be made to near-net-shape by reactive infiltration techniques. In general, such a reactive infiltration process entails contacting molten elemental silicon (Si) with a porous mass containing silicon carbide plus carbon in a vacuum or an inert atmosphere environment. A wetting condition is created, with the result that the molten silicon is pulled by capillary action into the mass, where it reacts with the carbon to form additional silicon carbide. This in-situ silicon carbide typically is interconnected. A dense body usually is desired, so the process typically occurs in the presence of excess silicon. The resulting composite body thus contains primarily silicon carbide, but also some unreacted silicon (which also is interconnected), and may be referred to in shorthand notation as "Si/SiC". The process used to produce such composite bodies is interchangeably referred to as "reaction forming", "reaction bonding", "reactive infiltration" or "self bonding".

Figure 13:
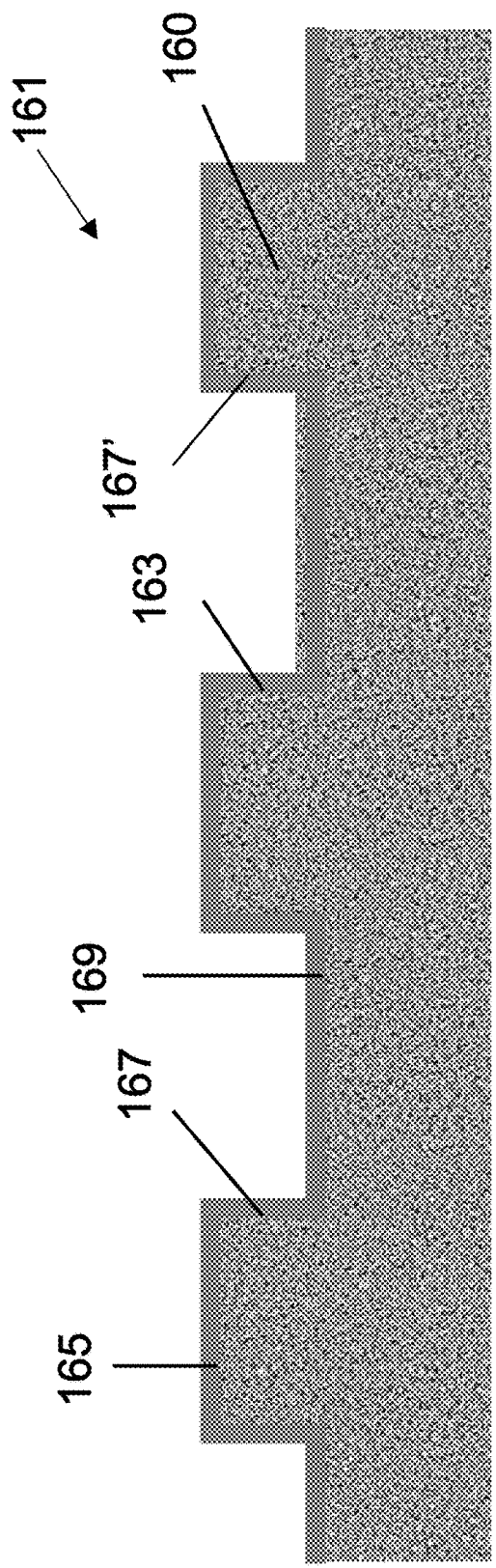
FIGS. 13-17 are cross-sectional schematic views of the sequence of process steps in a second aspect of the invention for selectively placing a DLC coating on the pins of a pin chuck through the use of a shadow mask.

FIG. 13 depicts a support surface 161 of a Si/SiC pin chuck that has been DLC coated. Here, the coating 163 has not been applied selectively, but rather has been applied over all exposed surfaces: the tops 165 and sides 167, 167' of pins 160, as well as on the valleys 169 between pins. Previously, Applicant stated that this was problematic due to stresses generated by thermal expansion mismatch. The DLC coating process involves a temperature excursion (rise) of about 200° C. However, the stress is only generated upon cooling the system below the coating temperature. Thus, if the elevated temperature is maintained during the subsequent process step(s), no stress will be generated.

Figure 14:
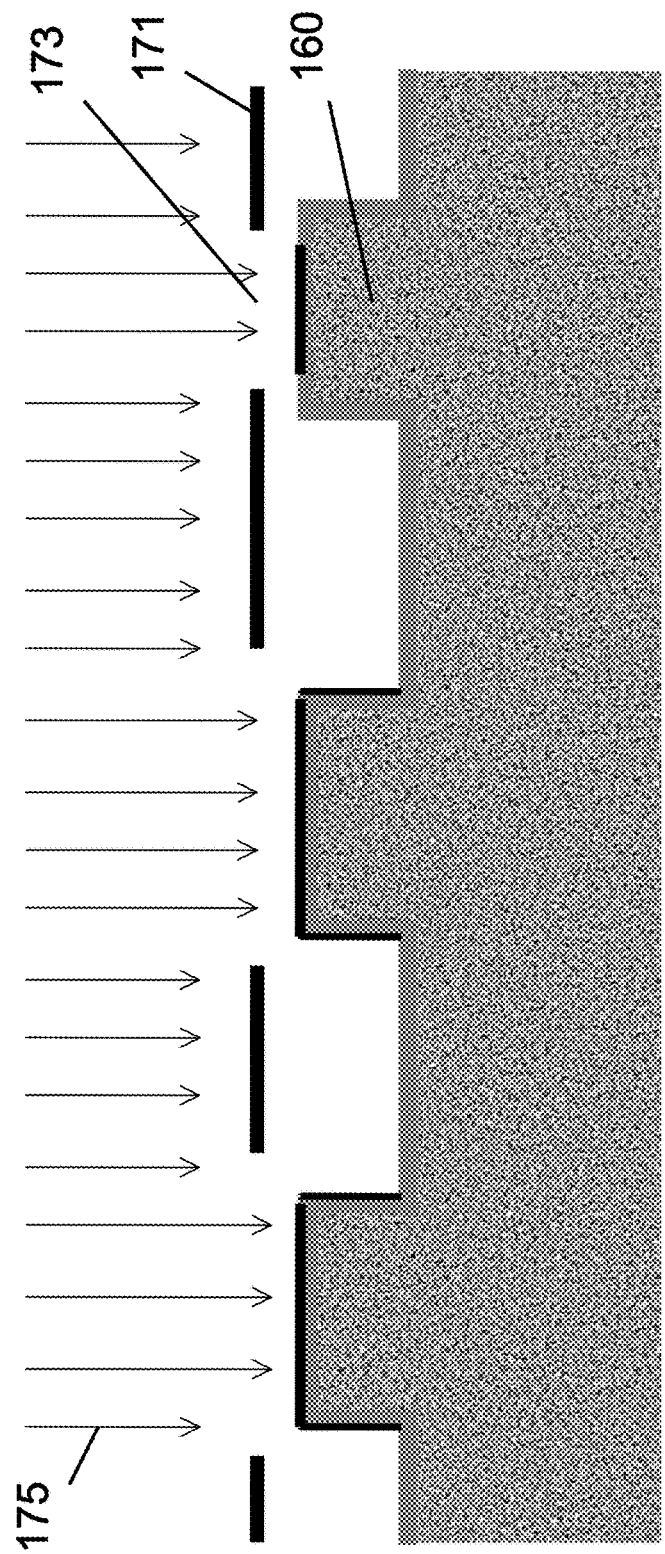

Thus, in the next step as depicted in FIG. 14, without cooling from the DLC coating temperature, a nickel-iron alloy may be sputter coated onto selected areas of the DLC coated pin chuck. In particular, a "subtractive mask" 171 made of INVAR nickel-iron alloy (a registered trademark of Aperam Alloys Imphy, France) containing a plurality of holes 173 that correspond in position to the pins 160 on the pin chuck is positioned over the DLC coated surface such that the holes 173 in the INVAR subtractive mask 171 line up with the pin tops 160.

Figure 15:
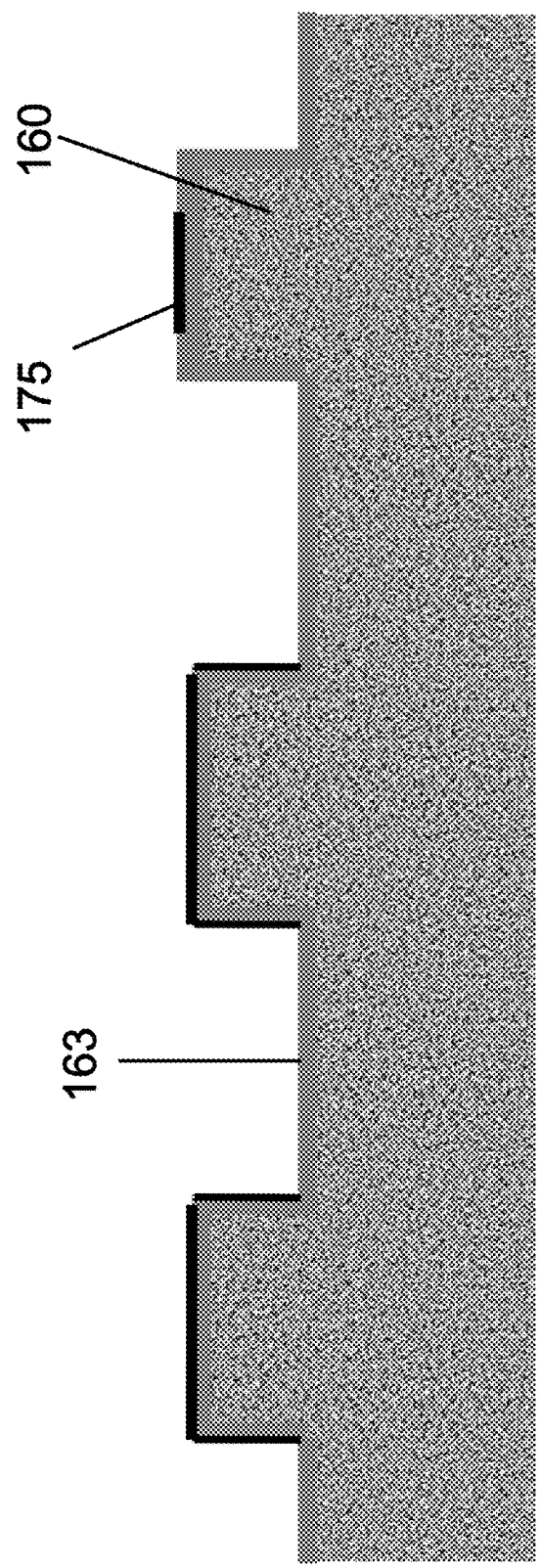

Next, nickel-iron alloy is sputter coated. Some of the coating 175 lands on the INVAR subtractive mask, and some of the Ni—Fe alloy passes through the holes in the mask and coats the pin tops, more or less, as depicted in FIG. 15. The portion of the coating that lands on the INVAR subtractive mask does not pose a problem because the similarity of the coating and subtractive mask material gives rise to little or no CTE mismatch, thus, little to no stress inducement, which could lead to spalling or warping.

The INVAR nickel-iron alloy has a CTE minimum of about 1.2 ppm/K (parts per million per degree Kelvin) at a composition of about 36 wt % Ni. If the coated Ni—Fe alloy has a composition between about 32 wt % Ni and about 42 wt % Ni, it should have a CTE less than about 6 ppm/K.

Figure 16:
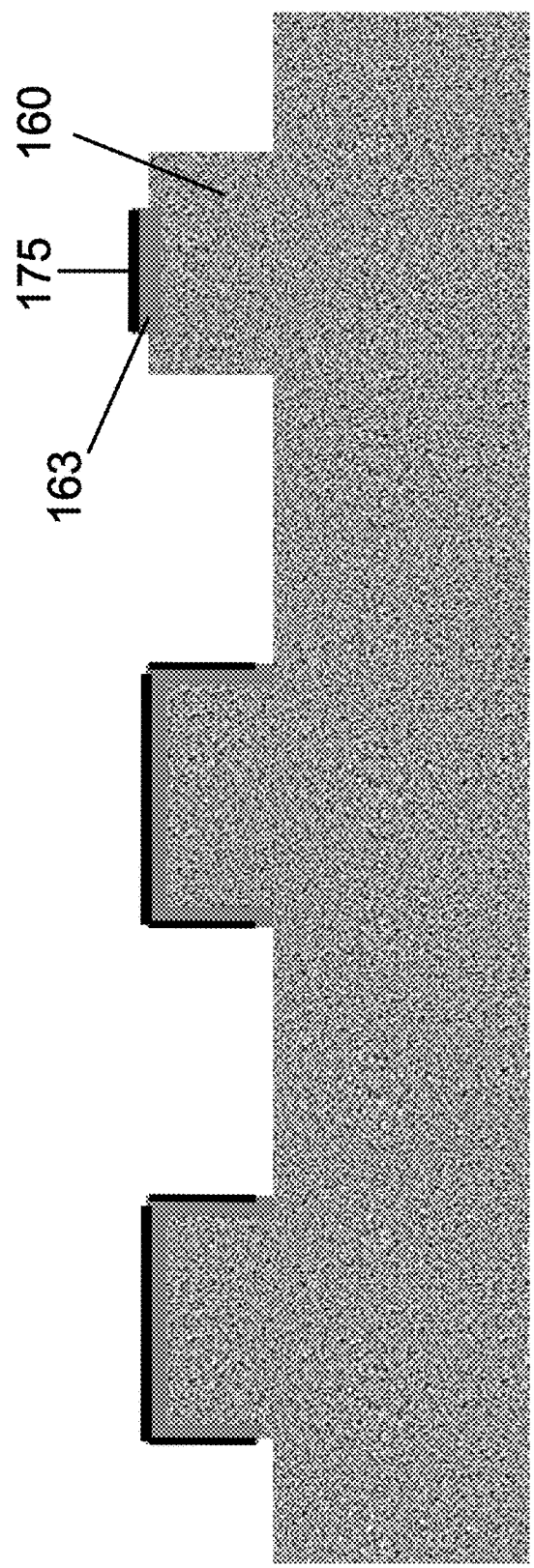

Again, without cooling from the process temperature, the INVAR subtractive mask is next removed. Then, the coated (DLC plus Ni—Fe coatings) pin chuck is exposed to oxygen plasma, or further heating in air to a temperature of about 500° C. The Ni—Fe coating can withstand these conditions, but the DLC coating cannot, except where protected by a Ni—Fe coating 175. The exposed DLC coating material 163 burns off as CO or $CO_2$, as depicted in FIG. 16.

Figure 17:
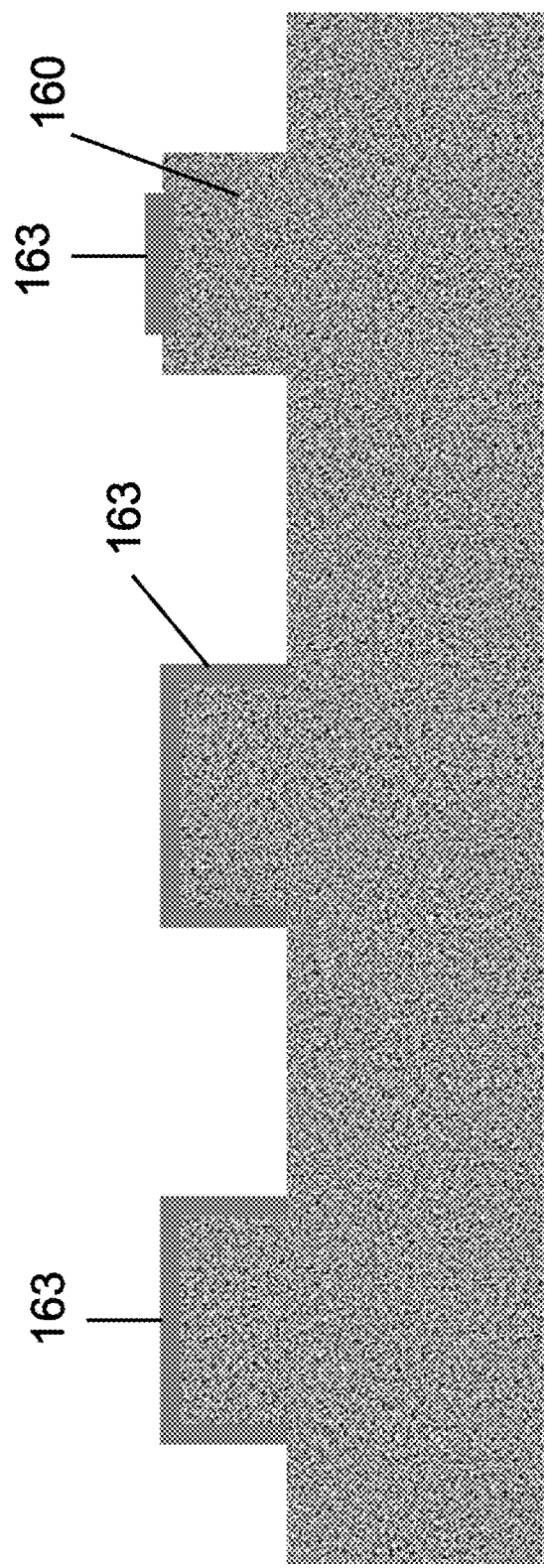

Lastly, the Ni—Fe coating 175 on the pin chuck, which is located largely on the pin tops, is removed by chemical means, e.g., an etchant for Ni—Fe. This chemical strip leaves the underlying DLC coating 163 intact, as depicted in FIG. 17.

Advantages of Particle/Bead Approach for Masking in Valleys

The use of small beads eliminates many of the previous limitations for precision masking and alignment. The use of glass, ceramic or metal beads break up the stress from the continuous film of DLC as experiences in film or shadow masks, thus minimizing the chances of micro masking or delamination.

Inorganic or high temperature organic beads will withstand the temperature excursion of the DLC coating process without distortion or delamination, and self adapt to the DLC stress.

High precision equipment is not needed to place the particles or beads. They simply fit into the valleys between the pins of a pinned chuck.

INDUSTRIAL APPLICABILITY/FIELD OF USE

Although much of the forgoing discussion has focused on articles, devices and methods relating to vacuum wafer chucks, one of ordinary skill in the art will recognize other related applications in the field of handling semiconductor wafers, such as:

Vacuum Wafer Tables
Electrostatic Chucks
Wafer Arms
End Effectors
Susceptors

Other applications where a pinned surface with low wear, low friction and/or low contamination is desired include:

Glass Handling Components for Flat Panel Display Manufacturing
Solar Cell Manufacturing Equipment An artisan of ordinary skill will appreciate that various modifications may be made to the invention herein described without departing from the scope or spirit of the invention as defined in the appended claims.

What is claimed is:

1. An article for supporting and clamping a component for processing, comprising:
    a) a plurality of pins extending from a chuck support surface, each pin having a terminal end, where said terminal end of each pin collectively define a plane; and
    b) at least one layer of a plurality of bodies each no larger than about 1000 microns covering said chuck support surface between pins, and not covering said terminal surface, wherein said plurality of bodies is in the form of beads.

2. In a chuck for supporting and clamping a component for processing, a method of selectively coating a terminal surface of substantially each of a plurality of pins extending from a support surface of said chuck, said method comprising:
    (a) providing a chuck having a support surface populated with a plurality of pins;
    (b) covering said chuck support surface other than said terminal surface of said pins, with at least one layer of a plurality of bodies;
    (c) coating substantially all of said chuck support surface and terminal surfaces of pins that extends from said chuck support surface with diamond-like carbon; and
    (d) removing said plurality of bodies from contact with said chuck support surface.

3. The method of claim 2, wherein said plurality of bodies is in the form of a slurry including a binder.

4. The method of either of claim 3, where the binder in the slurry is UV curable.

5. The method of claim 4, further comprising selectively curing the binder of the mixture that is located on the upper surface of the pin chuck between pins, and not located on pin tops, and then removing uncured binder.

6. The method of claim 2, wherein said plurality of bodies include glass, and are fused to form a frit.

7. The method of claim 2, wherein said chuck is a vacuum chuck having a vacuum seal land, and further wherein said plurality of bodies is in the form of loose beads.

8. The method of claim 7, wherein said vacuum seal land forms a wall to confine said loose beads.

9. A chuck for supporting and clamping a component for processing, comprising a plurality of pins extending from a chuck support surface, each pin having a terminal end coated with diamond-like carbon, further comprising a layer of a metal disposed on said diamond-like carbon coating, said metal having a thermal expansion coefficient not greater than about 6 ppm/K.

10. The chuck of claim 9, wherein said metal comprises a nickel-iron alloy.

\* \* \* \* \*